United States Patent [19]
Gates

[11] Patent Number: 5,554,849
[45] Date of Patent: Sep. 10, 1996

[54] MICRO-BOLOMETRIC INFRARED STARING ARRAY

[75] Inventor: James L. Gates, Lake Oswego, Oreg.

[73] Assignee: Flir Systems, Inc., Portland, Oreg.

[21] Appl. No.: 372,982

[22] Filed: Jan. 17, 1995

[51] Int. Cl.$^6$ ..................................................... G01J 5/20
[52] U.S. Cl. ................................. 250/370.08; 250/338.1; 250/338.4; 250/332
[58] Field of Search ............................... 250/338.4, 332, 250/370.08, 338.1, 349, 338.4, 332, 370.08

[56] References Cited

U.S. PATENT DOCUMENTS

| | | |
|---|---|---|
| 4,614,957 | 9/1986 | Arch et al. . |
| 4,654,622 | 3/1987 | Foss et al. . |
| 4,752,694 | 6/1988 | Hegel, Jr. et al. . |
| 4,948,963 | 8/1990 | Ballingall .......................... 250/338.4 X |
| 5,010,251 | 4/1991 | Grinberg et al. ......................... 250/332 |
| 5,286,976 | 2/1994 | Cole . |
| 5,446,284 | 8/1995 | Butler et al. .................... 250/370.08 X |

FOREIGN PATENT DOCUMENTS

| | | |
|---|---|---|
| 75842/81 | 5/1982 | Australia . |
| 77551/91 | 11/1991 | Australia . |
| 93/25877 | 12/1993 | WIPO . |
| 94/00950 | 1/1994 | WIPO . |
| 94/01743 | 1/1994 | WIPO . |

OTHER PUBLICATIONS

Monolithic Uncooled Infrared Image Sensor with 160×120 Pixels, Masashi Ueno et al., Semiconductor Research Laboratory, Japan, Jul., 1995, pp. 1–8.

"Thermal Isolation of High–Temperature Superconducting Thin films Using Silicon Wafer Bonding and Micromachining", Bang, Christopher A. et al., Journal of Microelectromechanical Systems, vol. 2, No. 4, Dec. 1993, pp. 161–164.

"CMOS Analog Circuit Design", Allen, Philip E. and Holberg, Douglas R., CMOS Technology, pp. 72–74.

"Uncooled Monolithic Silicon Focal Plane Development", Wood, R. A. et al., Jul., 1992, pp. 253–262.

"Design and Fabrication of Thin Film Monolithic Uncooled Infrared Detector Arrays", Liddiard et al., SPIE vol. 2225, pp. 62–63, 71.

"High–Performance Infrared Thermal Imaging with Monolithic Silicon Focal Planes Operating at Room Temperature", Wood, R. A., IEEE 1993, pp. 175–177.

Primary Examiner—Carolyn E. Fields
Assistant Examiner—Edward J. Glick
Attorney, Agent, or Firm—Kolisch Hartwell Dickinson McCormack & Heuser

[57] ABSTRACT

A micro-bolometric infrared (IR) staring array is described. The active element in each pixel within a two-dimensional array is a device having a selectively forward-biased p-n junction, e.g. a selectively biased diode. Each diode in the array serves as both an IR energy detecting element and a switching element. Each diode in a given row of the IR pixel array to be sensed, or read, is driven at a constant voltage, rendering its IR response highly controllable in the forward biased operating curve of the diodes in the addressed row. Diodes not being driven are, due to their reverse bias, in their off state producing minute leakage current and thus make no significant contribution to the sensed current representing a given pixel's IR exposure. The row-addressed driven or active diodes are sensed column by column by sample and hold techniques to produce a two-dimensional IR pixel image of a target. This simplifies the geometries as well as the cell structures while increasing the fill ratio to greater than approximately fifty percent. Moreover, manufacturing yields are greatly improved because of the topologic and process simplicities and compatibility with standard integrated circuit processes.

12 Claims, 3 Drawing Sheets

MICRO-BOLOMETRIC INFRARED STARING ARRAY

BACKGROUND OF THE INVENTION

The present invention relates generally to infrared (IR) imaging or staring arrays. More particularly, the invention concerns a micro-bolometric semiconductor IR staring array that provides substantially improved sensitivity in a bolometric device and structure exhibiting greatly increased manufacturability and thus high-performance yield.

High-performance infrared imaging applications require high sensitivity and TV quality in terms of clarity, contrast, resolution and continuity of flicker-free motion. Such applications include daytime and night-time personnel and vehicle pilotage, navigation and reconnaissance for military and commercial enterprises. Nevertheless, there traditionally have been two principal constraints against the development of such high-performance uncooled infrared imaging systems: substantial improvements are required in first, the detector and second, the readout circuitry of what will be referred to herein as an uncooled focal plane array (UFPA) that forms the eye of the system.

Typically, in the design and fabrication of infrared sensors utilizing bolometric detection mechanisms, it is appropriate to select an approach which provides the following features: 1) a large percentage of photon absorption ($\geq 90\%$) in the wavelength band of interest (typically 8–14 microns); 2) high thermal isolation of the detector element to maximize photon absorption-related temperature changes (typically $10^{-7}$ W/°C.); 3) a high temperature coefficient of a measurable parameter (typically resistance at 2%/°C.); 4) a thermal time constant to correspond to the electronic detector sampling rate (typically 10–20 msec); and 5) an electronic switch pixel address mechanism (typically a diode, bipolar or field-effect transistor (FET)) and interconnect circuitry within the pixel to access the bolometric detector element and to sample the infrared radiation-induced signal variation.

Conventional bolometric IR staring arrays have used temperature-sensitive resistors (thermistors) as the IR energy-sensitive or active detector elements thereof. Such resistors based on either metallic or semiconductor films have required suspension above or alongside the semiconductor array signal-sensing circuitry that takes the form of a diode or switchable transistor (an operating characteristic of which indicates to an array-scanning processor the amount of IR energy incident on the plural pixel array). Such thermal isolation structures and associated signal sensing circuitry are difficult to manufacture due to a large number of complex processes, and notoriously have produced yield problems in manufacture and attendant low-yield cost increases.

Briefly summarizing the invented staring array, the bolometric infrared detection element in each pixel within a two-dimensional array is a thermally isolated semiconductor device and associated photon absorption structure having a selectively forward-biased semiconductor junction, e.g. a selectively biased diode. Each pixel diode in the array serves as both a bolometric type detecting element and a switching element. Each diode in a given row of the IR pixel array to be sensed, or addressed, is driven at a constant voltage, rendering its bolometric response highly controllable in the forward-biased operating curve of the diodes in the addressed row. Diodes not being driven, due to their reverse bias, are in their off state, thus producing a small leakage current and thus make no significant contribution to the sensed current representing an addressed pixel's absorbed IR exposure. The row-addressed driven or active diodes, characterized by thermal time constants selected to be compatible with the staring sensor frame rate are sensed to produce a two-dimensional IR pixel image of a scene. This new bolometric pixel architecture simplifies the geometries as well as the cell structures while producing a large detector fill ratio of greater than approximately fifty percent. Significantly, manufacturing yields are greatly improved because of the topologic and process simplicities.

Accordingly, it is a principal object of the present invention to provide a simplification in the pixel structure that eliminates the need for a separate pixel-addressing device, incorporating this function into the bolometric semiconductor diode detection element.

It is a further object of the present invention to replace the conventional linearly resistive film bolometer with a forward biased semiconductor diode bolometer that provides increased temperature sensitivity.

Yet another object is to provide a bolometer characterized in that it provides inherent pixel addressing capability.

Still another object of the invention is to provide a cost-effective and high-yield array using processes and materials that are at least compatible, and perhaps synergistic, with standard integrated circuit (IC) manufacturing techniques and materials.

These and additional objects and advantages of the present invention will be more readily understood after a consideration of the drawings and the detailed description of the preferred embodiment.

DETAILED DESCRIPTION OF THE PREFERRED EMBODIMENT

Figure 1:
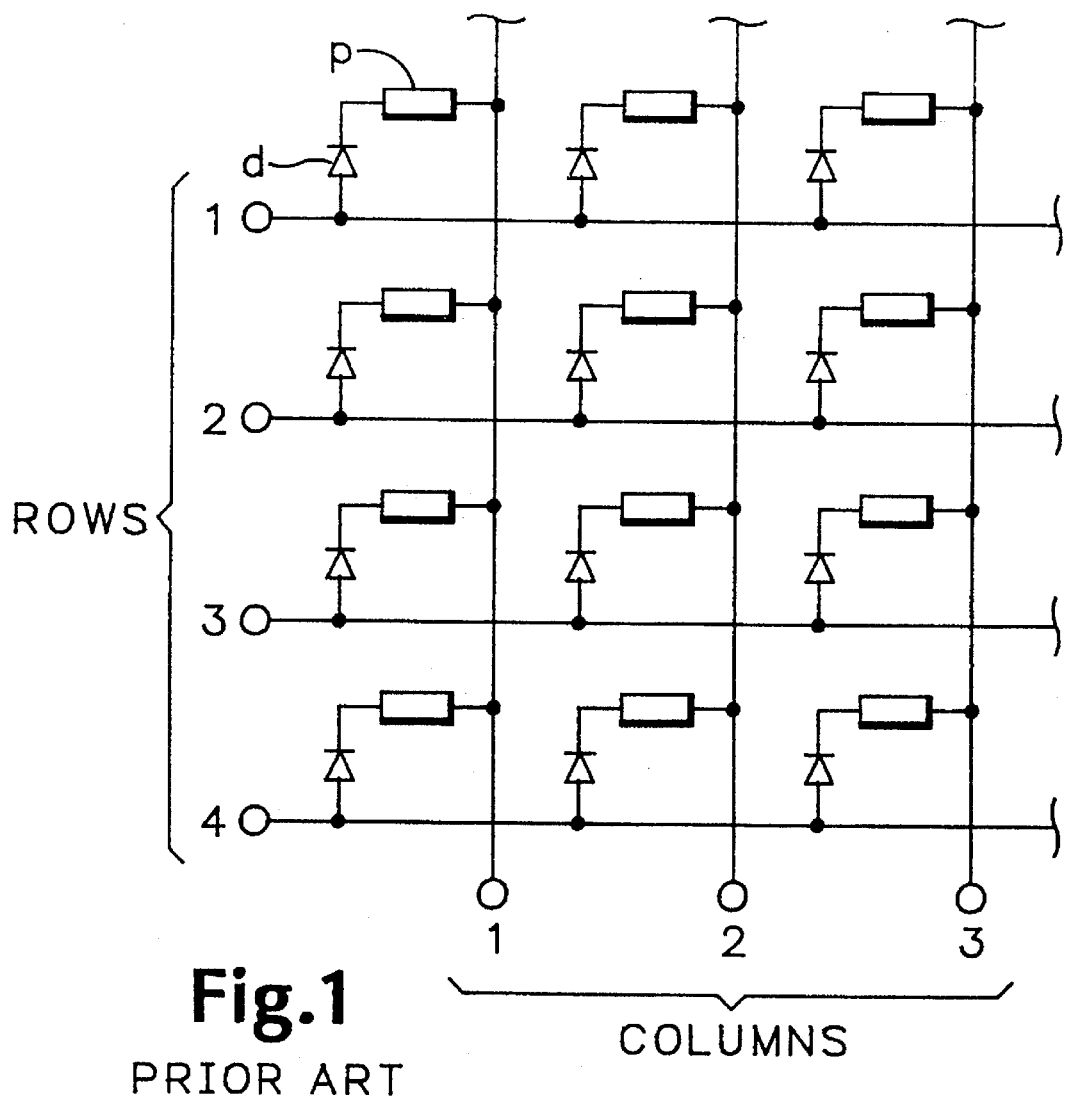
FIG. 1 is a schematic diagram of a prior art UFPA system including steering diodes in series with bolometric elements.

The invention is described and illustrated as a two-dimensional array of IR bolometric pixel elements formed above a semiconductor readout substrate. Such elements are described as being arrayed in rows and columns, and the rows of elements are described as being successively driven and therebetween the columns as being sensed, one after another. It will be appreciated that rows and columns and the driving and sensing thereof are not intended as limitations, but rather are used as convenient labels for the organization and conduct of the invented array. For example, a two-dimensional array having the rows and columns reversed from the configuration illustrated herein, and/or having the drive and sense functions and/or structure reversed from that shown herein, nevertheless is within the spirit and scope of the invention. Other modifications to the preferred embodiment of the invention, which are influenced by the teachings hereof, similarly are contemplated.

In a standard NTSC video format, used to readout the UFPA, the video horizontal line time is 63.5 microseconds (μsec), of which 51.5 μsec is the active line time in which all pixels along any given row would be read out, or sampled. Prior bolometric UFPAs have used semiconductor thin films with a low temperature coefficient of resistance (TCR) (typically 1–2%/°C.) and in order to achieve high signal levels from incoming IR radiation, large detector bias currents are required (typically 200–300 μamperes per pixel (μA/pixel)). This large bolometer current creates a problem for the three-column, four-row steering diode d and bolometer p circuit shown in the simplified schematic diagram of FIG. 1 (which corresponds generally with FIG. 4 of International Patent Application No. PCT/US93/05740 (WIPO Publication No. WO 94/00950) entitled "Infrared Camera with Thermoelectric Temperature Stabilization" in that a large row current is required for large UFPAs (typically 640 pixels×250 μA/pixel=160 mA). A preferred implementation as taught by that patent is a bipolar transistor switch and thermistor (QP and RP) version shown in FIG. 2 (which corresponds generally with FIG. 5 thereof), which implementation requires less row current to be drawn by each row. (It will be understood that the remaining elements, $QR_1$–$QR_4$, $QC1_1$–$QC1_3$, $QC2_1$–$QC2_3$, QAMP1, QAMP2, RR1–RR4, RC1 and RC2 are part of the row/column drive/sense circuitry required in some form also by the present invention). A typical semiconductor bolometer has a resistance of 10 kΩ, so a typical bolometer bias would be approximately 2.5 V.

This combination of high bolometer current and high bolometer resistance can produce significant bolometer heating due to the excellent thermal isolation ($10^{7o}$ C/W) of the bolometer. In order to reduce heating, the bolometer is turned on (sampled) only during a small portion of the horizontal line time, typically a pulse bias of 5–6 μsec is applied to the bolometer and a preferred addressing scheme has been to address fourteen pixels (bolometers) at a time. Because of the short duration of the time to read out signals from the bolometric array, high-bandwidth amplifiers are required—typically external to the UFPA.

Figure 2:
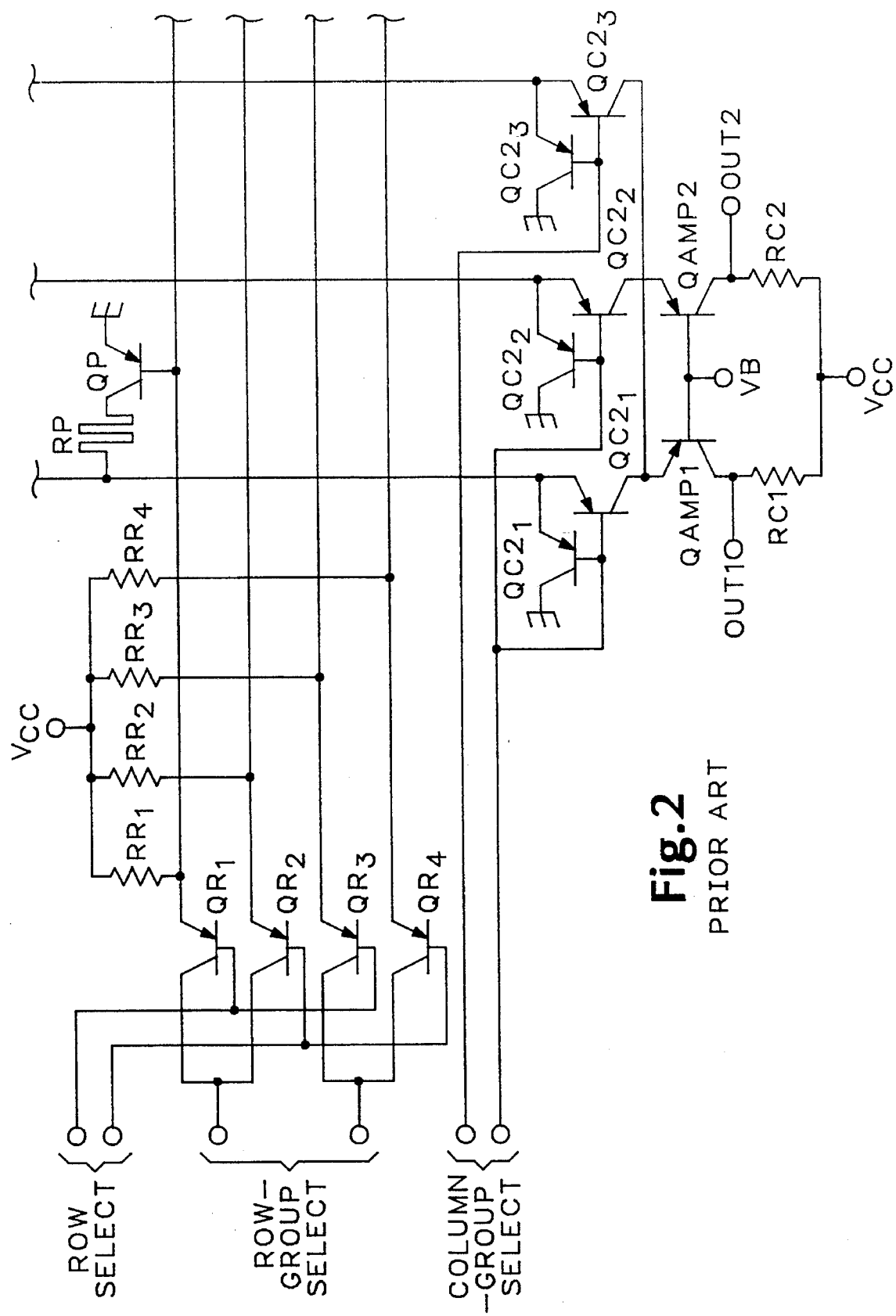
FIG. 2 is a modified schematic diagram of the UFPA system of FIG. 1 showing an implementation with a bipolar transistor switching device and a thermistor for each cell thereof.

This present invention merges the diode and bolometer into a simpler structure than that schematically shown in FIG. 1 representing the referenced prior art patent. The row current limitations of the prior art are not experienced because the diode bolometer has much greater sensitivity (TCR), e.g. typically 8–12%/°C., and thus only one-fifth as much row current is required in order to achieve equivalent responsivity. The bolometer bias heating is also less because less current (typically 50 μA) and less voltage (typically 0.5 V) is seen by the diode bolometer elements. The lower bolometer power eliminates the requirement for short pulse biases (5 μsec) and the bolometer sample time can be increased (if desired) up to the horizontal line time limitation mentioned above.

The increase in bolometer sample time reduces the requirement for very high bandwidth external amplifiers (off-chip) and appropriate amplifiers with sample-and-hold circuitry (if desired) can be built on-chip to simplify the UFPA system. The sample-and-hold circuitry is desirable to allow independent selection of the diode bolometer sample time and the horizontal line rate. All bolometers along any selected row can be sampled for a desired duration, or blocks of diode bolometers can be sampled to further reduce the row current supplied to the bolometers.

The on-chip amplifiers also permit the use of infrared-opaque reference bolometers to counteract low-frequency uncooled focal plane array (UFPA) temperature drifts in the active bolometer signal. This eliminates or at least reduces the requirement for extremely accurate UFPA temperature stabilization.

The invented IR staring array now will be described by reference to FIGS. 3 and 4. The invented IR staring array is illustrated schematically in FIG. 3 at 10. Array 10 may be seen to include a preferably orthogonal, two-dimensional array of bolometric diodes $D_{11}$ through $D_{rc}$ of which $D_{mn}$ is typical (where r is the number of diode rows $R_n$ and c is the number of diode columns $C_m$ in the array) having column-common cathodes and row-common anodes, with each diode $D_{mn}$ in the array being connected between one of plural such rows and one of plural such columns. It will be appreciated by those skilled in the art that, by forward biasing the diodes in a given row such as row $R_2$, the bolometric response of each diode in the given row can be measured by sampling the current flow from the cathodes of the diodes in each column. Because the diodes exhibit a variable forward resistance that is highly temperature-dependent, i.e. they act as bolometers, the measured currents represent a measure of the amount of IR energy incident and absorbed to produce a temperature change on the diodes within the given row.

By reverse biasing the diodes within rows other than the given row while forward biasing the diodes within the given row, there will be only negligible (negative) contribution by the reverse-biased diodes to the current flow measurable from the diodes' common cathodes within each column, i.e. the reverse-biased diodes will permit reverse leakage current, from the common cathode node of the array, which leakage current can be reduced to the nanoampere (nA) level. Significantly, the diodes in the invented bolometric array shown schematically in FIG. 3 act not only as bolometers for purposes of detecting absorbed IR energy incident thereon, but act also as controllable switching (steering) devices for purposes of reading the level of the detected energy.

This dual function of diodes $D_{11}$ through $D_{rc}$ drastically reduces unit cell complexities including IC topological complexity, IC surface feature complexity, and wafer fabrication complexity over conventional arrays utilizing thermistors as IR detector elements and diodes or transistors as detector addressing elements. The dual functionality of this invention also saves array surface area 'overhead' or the real estate cost of the associated circuitry that must be laid down around each unit cell within the array. Detector sensitivities less than 50 milliKelvins (mK) noise equivalent temperature difference (NETD) (at f/1 with a 30 Hz frame rate) are possible. This is due to high detector fill ratios greater than approximately fifty percent in a 50 μm×50 μm pixel size, which maximizes the percentage of surface area devoted to detecting IR energy. Production yields are increased; detector sensitivity is improved; device cost is reduced.

It will be understood by skilled persons in the art that the fractional temperature coefficient (TC) of an IC-implemented, forward-biased, pn-junction diode in terms of forward current therethrough is given by Equation 1 as follows:

$$\frac{1}{i_D} \cdot \frac{di_D}{dT} = \frac{1}{I_S} \cdot \frac{dI_S}{dT} - \frac{V_D}{TV_t} = \frac{3}{T} + \left[ \frac{V_{Go} - V_D}{TV_t} \right]$$

wherein $i_D$ is the diode's forward bias current, $I_s$ is the diode's reverse saturation current, T is temperature (Kelvin), $V_t$ is the thermal voltage (kT•$q^{-1}$), $V_{GO}$ is the semiconductor bandgap voltage and $V_D$ is the diode's forward voltage. From Equation 1 and assuming that $V_D$=0.6 volts (0.6 V), which is typical for a forward-biased silicon (Si) diode, the fractional TC is 0.01+(0.155−0.077)=0.0879. From this, then, the forward diode current will double for approximately a 10° C. rise in temperature. This assumes that the diode voltage $V_D$ is held constant at 0.6 volts forward bias during the diode current sensing time. This invention is not to exclude other semiconductor materials, their crystalline state (crystalline, poly-crystalline or amorphous) or methods of diode construction (homo, hetero or schottky junctions).

The invented staring array takes advantage of this characteristic temperature dependence of a forward-biased semiconductor diode's current on the diode's junction temperature to detect IR radiation incident upon and absorbed in the thermally isolated detector structure. Accordingly, it is possible in accordance with the preferred embodiment of the invention to provide a very uniform and sensitive IR detection mechanism in a two-dimensional semiconductor staring array, yet with a unit cell that, because it requires only one electronic device, e.g. a single diode, rather than two, e.g. a thermistor and a switch, is relatively simple to fabricate to produce high yield at low cost. All that is needed is a regulated constant-voltage source for selectively and sequentially driving the diode rows, and sense lines operatively coupled with appropriate low-impedance circuitry for sensing incident IR radiation-dependent variations in the forward current of the forward biased diode in each column. Conventional controller and memory management techniques are used to digitize and store pixel data for the driven and sensed staring array, thereby to produce two-dimensional IR image data for analysis, transmission, display, etc. Reference bolometers can be utilized to subtract out low-frequency diode bolometer temperature drifts.

Device manufacture is achievable by conventional microbolometric circuit and semiconductor design and fabrication, and control of the device in operation to read the IR pixel image therefrom is achievable by conventional array scanning techniques, which will not be described in detail herein. Device fabrication in terms of substrate, deposition, air gap and interconnection configurations, may, for example, proceed in accordance with the teachings of International Patent Application No. PCT/AU91/00162 (International Publication No. WO 91/16607) entitled "Semiconductor Film Bolometer Thermal Infrared Detector", the above-referenced International Patent Application No. PCT/US93/05740 (WIPO Publication No. WO 94/00950) entitled "Infrared Camera with Thermoelectric Temperature Stabilization" and/or U.S. Pat. No. 5,286,976 entitled "Microstructure Design for High IR Sensitivity", as such teachings are supplemented below by reference to FIGS. 3 and 4. Diode bolometer construction and thermal isolation may also use wafer bonding techniques as detailed in "A Silicon Wafer Bonding Approach for High Temperature Superconducting Bolometers", which report is published in the December, 1993 issue of the IEEE Journal of Micromechanical Systems (2,4) at pages 160–164.

The invention now may be understood to be described as follows, with brief reference to FIG. 3. Two-dimensional bolometric array 10 preferably includes plural semiconductor devices, e.g. diodes 12, 14, 16, 18, arranged in a generally planar two-dimensional array across a semiconductor substrate. Preferably, each device in the array may be characterized as including a p-n semiconductor diode junction, by which is broadly meant either a p-n or n-p junction or any other type of semiconductor junction that exhibits a diode-type response or V-I characteristic. In other words, within the spirit and scope of the invention, any semiconductor device exhibiting controllably substantially different forward and reverse bias resistance or conductance characteristics is considered as having the claimed p-n semiconductor junction.

It will be appreciated by those skilled in the art that the so-called p-n semiconductor junction is normally reverse biased, and is selectively forward biasable by the application of a positive potential above the junction's threshold voltage such that its active layer is exposable to infrared energy incident on the device, with the device exhibiting a determinedly variable response to a varying amount of absorbed infrared energy incident upon the device. Importantly for high sensitivity and accuracy, each device is thermally isolated from a substrate that forms a part of that device with an appropriate thermal time constant, e.g. by the illustrated trench/bridge surface technique of FIG. 4.

Figure 3:
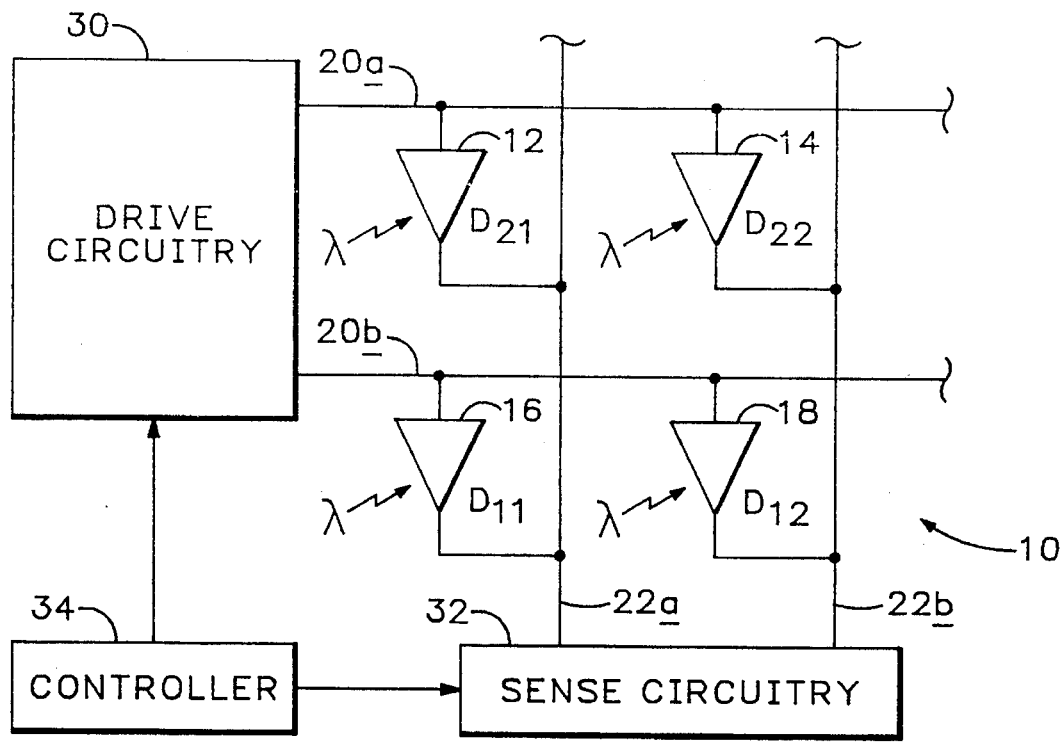
FIG. 3 is a schematic diagram of the invented IR staring array.

Referring to FIG. 3, each device has on one side of the p-n junction a drive line 20 for applying a bias thereto and each device has on another side of the p-n junction a sense line 22 for measuring the device's response to the amount of absorbed IR energy incident on the device. By the preferred array-scanning technique, plural ones of the plural devices share one or more common drive lines, e.g. those devices in a given row $R_n$, or one or more common sense lines, e.g. those devices in a given column $C_m$, controllable by associated bolometric array drive and sense circuitry. It will be appreciated that such control is conventional, and may include known row and column addressing logic, drive circuitry and sense circuitry including conditioning and amplifying circuitry that preferably forms part of each column's sample-and-hold circuitry. Those of skill will appreciated that such drive and sense circuitry may be multiplexed to each driven row and each sensed column and thus may be rendered common to more than one row and column. Such circuit reduction techniques decrease the electronic bandwidth requirements and reduce bolometer heating.

Those skilled in the art will appreciate that the preferably regularly arrayed micro-bolometric devices that make up array 10 may be subject to temperature variations due to ambient temperature conditions. Such may be compensated by conventional means such as by the use of reference bolometric devices that may be configured, for example, in bridge compensation networks that contribute opaque IR pixel data as part of the regular two-dimensional array. In such bridge network arrangements, it will be understood, common mode temperature variations or drift over time automatically are cancelled from the effectively differential temperature variation measurement that is used by the controller to indicate the amount of IR energy incident upon the devices of array 10.

Figure 4:
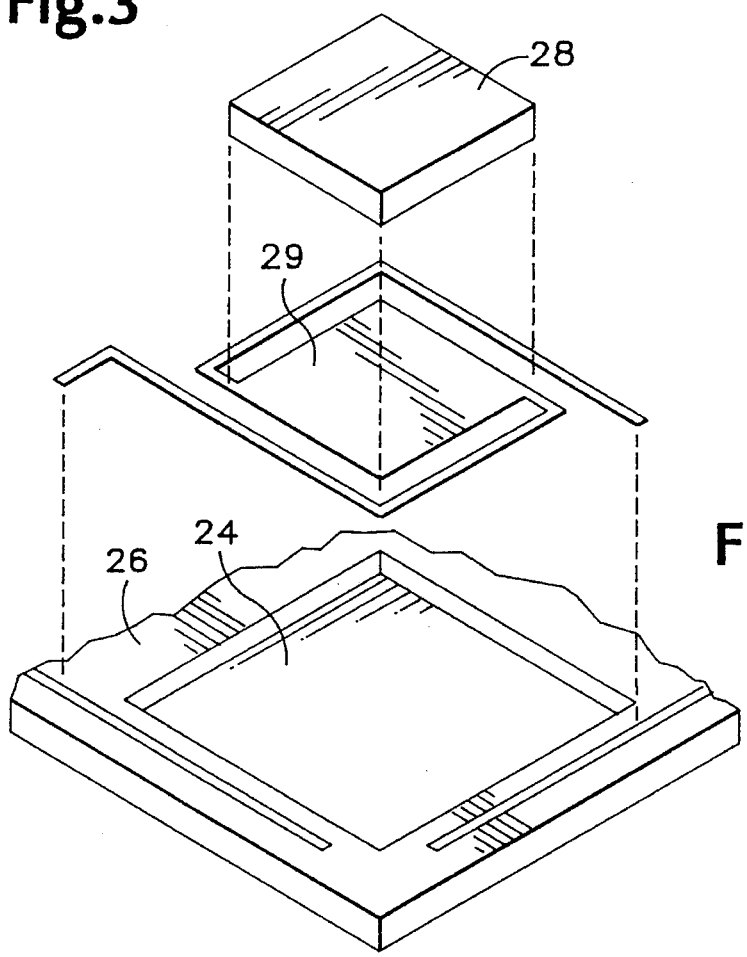
FIG. 4 is a fragmentary, isometric view of one cell of the array made in accordance with the preferred embodiment of the invention.

Referring briefly to FIG. 4, the manner in which a device might be constructed is illustrated. Those skilled in the art will appreciate that only one structural embodiment is shown, while many are possible within the spirit and scope of the invention. In the illustrated embodiment, a trench 24 is etched into a wafer's substrate 26 (e.g. of Si) beneath an active layer 28 that forms a diode device of array 10 and its drive line 20 and sense line 22 that suspend it above trench 24 like a bridge, as by a pellicle or membrane 29 (e.g. of $Si_3N_4$). Trench 24 provides for the thermal isolation of each diode $D_{mn}$, producing a preferably very low thermal conductance $g_T$ of less than approximately $10^{-7}$ W/°C. It will be appreciated that any suitable technique for thermally isolating the active devices, e.g. preferably semiconductor diodes $D_{mn}$, from the substrate and or associated drive or sense circuitry-including tile subtractive trench structure, an additive superstructure, a combination of additive (e.g. deposit, bond) and subtractive (e.g. etch, lift-off) techniques, etc. is within the spirit and scope of the invention. The photon absorption can be provided by a suitable metal/dielectric/metal system (such as that reported in the June, 1988 issue of the Journal of Vacuum Science & Technology (A6(3)) at pages 1686–1689) either attached to or built into the diode bolometer structure. Preferably, an orthogonal, two-dimensional array of such devices, or cells, only one of which is shown in FIG. 4, are provided as described and illustrated schematically in FIG. 3.

It may be seen that, in accordance with the preferred embodiment of the invention shown in FIG. 3, selective ones of the plural devices, e.g. those in a given row $R_n$, may share a common drive line such as drive line 20a and each of such selective ones of said plural devices is sensed in succession by plural sense lines, e.g, those of a given column $C_m$. Also in accordance with the preferred embodiment of the invention shown in FIG. 3, selective ones of the plural devices, e.g. those of a given column $C_m$, share a common sense line such as sense line 22a and each of the selective ones of such plural devices is driven in succession by plural drive lines, e.g. drive lines 20a, 20b, each of a given row $R_n$. Such is most preferred in an embodiment of the invention in which said array is two-dimensional. In such case, selective ones of the plural devices preferably share a common drive line, e.g. 20a, and each of the selective ones of the plural devices preferably is sensed in succession by plural sense lines, e.g. 22a, 22b, and selective ones of the plural devices share a common sense line, e.g. 22a, and wherein each of said selective ones of said plural devices is driven in succession by plural drive lines, e.g. 2a, 20b.

It may be seen from FIG. 3 that selected ones of the p-n junction devices, or diodes, have common anodes and have a sense line corresponding to each of plural cathodes. It also may be seen from FIG. 3 that selected ones of the p-n junction devices, or diodes, have common cathodes and have a sense line corresponding to each of plural anodes. It also may be seen that array 10 preferably is two-dimensional, and most preferably extends along two axes that are perpendicular to one another, thereby rendering a right regular IR pixel array. The p-n junction devices preferably are diodes, selected ones of which have common anodes and a sense line corresponding to each of plural cathodes, and selected ones of which have common cathodes and a drive line corresponding to each of plural anodes. This use of diodes in a two-dimensional array, whereby the IR energy incident at a given pixel may be sensed by forward biasing a row of diodes and successively sampling and holding, and preferably digitizing, a sense signal from each column of diodes in the array, permits a diode corresponding to each IR pixel in the array to act as what may be thought of as an 'active' thermistor, i.e. not only a thermistor, but also a switch, to permit singularly selective IR pixel data to be sensed.

Another way of describing the invention follows. The invention may be thought of as a bolometric array 10 formed on a substrate, array 10 including 1) a generally planar two-dimensional arrangement of semiconductor diodes, e.g. diodes $D_{1,1}$ through $D_{r,c}$, defining addressable rows $R_n$ each of which contains plural diodes having common anodes and a connected drive line and addressable columns $C_m$ each of which contains plural diodes having common cathodes and a connected sense line such as sense line 22a; 2) drive circuitry 30 for driving a selected one of the rows, e.g. row $R_1$, via a connected drive line; 3) sense circuitry 32 for sensing each one of the columns $C_i$ through $C_m$ via a connected sense line in a defined column-by-column succession; and 4) a controller 34 for controlling drive circuitry 30 selectively to drive ones of the rows in a defined row-by-row succession and for imposing synchronization between drive circuitry 30 and sense circuitry 32 to achieve drive-and-sense scanning of array 10 to produce an infrared energy-indicative two-dimensional pixel image representative of the infrared energy incident upon the array.

Preferably, the controller operates to produce a timed succession of plural ones of the two-dimensional images at a substantially flicker-free periodic rate, i.e. controller 34 produces a fluid motion picture. Also preferably, diodes $D_{l,l}$ through $D_{r,c}$ in the two-dimensional arrangement are substantially thermally isolated from substrate 26. Also preferably, the diodes fill approximately fifty percent or greater of the surface area, having an approximately ninety percent photon absorption factor, of the generally planar diode arrangement within array 10. Finally, the diodes preferably are arranged with a packing density sufficiently high to enable controller 34 to produce two-dimensional pixel images approximating TV, and preferably full TV, resolution, the latter referring to resolution of approximately 480 rows and approximately 640 columns.

Those of skill will appreciate that drive circuitry 30, sense circuits 32 and controller 34 may be of conventional design, but it is noted herein that drive circuit 30 need not be as robust as in conventional bolometric arrays due to the unique, lower current diode-as-bolometer-and-switch structure of each cell in the proposed array. Sense circuitry 32 preferably utilizes conventional sample-and-hold circuitry to measure and store the effect on each sense line 22 of IR energy incident on the bolometer corresponding to each drive line 20. Controller 34 straightforwardly addresses successive drive lines 20 representing diode rows $R_n$ and reads successive sense lines 22 representing diode columns $C_m$, thereby to capture two-dimensional IR pixel image data in memory. It will be appreciated that any or all of drive circuitry 30, sense circuitry 32 and controller 34 may be integrated onto the wafer or device that contains the bolometric array, or that it may, within the spirit and scope of the invention, be located off-chip as in a separate IC mounted on a common or different substrate.

In accordance with a preferred embodiment of the invention, the array described above may be fabricated using standard state-of-the-art semiconductor wafer fabrication techniques, e.g. in silicon substrates using complementary metal-oxide semiconductor (CMOS) or bipolar CMOS (BiCMOS) processes. Thermal isolation of the diodes in the bolometric array may be accomplished as described above in keeping with known trench/bridge surface techniques. Arrays having a fill factor f of greater than fifty percent, having a thermal conductance $g_T$ of less than $10^{-7}$ W/°C., having photon absorption factors greater than eighty percent (using known techniques), and having thermal response times $t_r$ of approximately 10 ms (this latter yielding real-time, motion picture speed imaging) are possible. Thus, the invented UFPA array realizes the objects of higher sensitivity and resolution in that a 480×640 IR pixel array made in accordance with the invention can be read at sufficiently high speeds to achieve TV resolution, i.e. $\leq$50 mK NETD at f/1 with flicker-free, continuous-motion, 30-Hz frame rate. Yet, array costs are reasonable due to unit cell simplicity and greatly improved manufacturing yields.

While the present invention has been shown and described with reference to the foregoing preferred embodiment, it will be apparent to those skilled in the art that other changes in form and detail may be made therein without departing from the spirit and scope of the invention as defined in the appended claims.

I claim:

1. A two-dimensional bolometric array comprising:

plural bolometer devices arranged in a generally planar two-dimensional array across a semiconductor substrate, each bolometer device in said array being characterized as a semiconductor junction that is, by external drive means, normally reverse biased and that is selectively forward biasable at a substantially fixed forward bias voltage produced by external means, said device being exposable to infrared energy incident on said device and said device exhibiting a determinedly variable response to a varying amount of absorbed infrared energy incident upon said device, said device being thermally isolated from said substrate that forms a part of said device, said device having on one side of the junction a drive line for applying a bias thereto and having on another side of the junction a sense line for measuring said device's response to the amount of infrared energy incident on said device, wherein plural ones of said plural devices share one or more common drive or one or more common sense lines controllable by associated bolometric array drive and sense circuitry.

2. The array of claim 1, wherein selective ones of said plural devices share a common drive line and wherein each of said selective ones of said plural devices is sensed in succession by plural sense lines.

3. The array of claim 1, wherein selective ones of said plural devices share a common sense line and wherein each of said selective ones of said plural devices is driven in succession by plural drive lines.

4. The array of claim 1 in which said array is two-dimensional, wherein selective ones of said plural devices share a common drive line and wherein each of said selective ones of said plural devices is sensed in succession by plural sense lines and wherein selective ones of said plural devices shares a common sense line and wherein each of said selective ones of said plural devices is driven in succession by plural drive lines.

5. The array of claim 1 in which said devices are diodes and selected ones of the devices have common anodes and have a sense line corresponding to each of plural cathodes.

6. The array of claim 1 in which said devices are diodes and selected ones of the devices have common cathodes and have a drive line corresponding to each of plural anodes.

7. The array of claim 1 in which said array is two-dimensional and in which the devices are diodes selected ones of which have common anodes and a sense line corresponding to each of plural cathodes, and selected ones of which have common cathodes and a sense line corresponding to each of plural anodes.

8. A bolometric array formed on a substrate, said array comprising:

a generally planar two-dimensional arrangement of semiconductor diodes defining addressable rows each of which contains plural diodes having common anodes and a connected drive line and columns each of which contains plural diodes having common cathodes and a connected sense line, wherein each diode is a bolometer;

drive circuitry supplying a fixed forward bias voltage to drive a selected one of said rows via a connected drive line;

sense circuitry for sensing each one of said columns via a connected sense line in a defined column-by-column succession; and a controller for controlling said drive circuitry to selectively drive ones of said rows in a defined row-by-row succession and for imposing synchronization between said drive circuitry and said sense circuitry to achieve drive-and-sense scanning of said array to produce an infrared energy-indicative two-dimensional pixel image representative of the infrared energy incident upon said array.

9. The array of claim 8, wherein said controller operates to produce a timed succession of plural ones of said two-dimensional images at a substantially flicker-free periodic rate.

10. The array of claim 8, wherein said diodes in said two-dimensional arrangement are substantially thermally isolated from said substrate.

11. The array of claim 8, wherein said diodes fill approximately fifty percent or greater of the surface area of said generally planar diode arrangement within said array.

12. The array of claim 8, wherein said diodes are arranged with a packing density providing said controller with the ability to produce two-dimensional pixel images having a resolution of approximately 480 rows and approximately 640 columns.

* * * * *